United States Patent
Luo et al.

(10) Patent No.: US 10,915,395 B2
(45) Date of Patent: Feb. 9, 2021

(54) READ RETRY WITH TARGETED AUTO READ CALIBRATE

(71) Applicant: Micron Technology, Inc., Boise, ID (US)

(72) Inventors: Ting Luo, Santa Clara, CA (US); Kishore Kumar Muchherla, Fremont, CA (US); Harish Reddy Singidi, Fremont, CA (US); Xiangang Luo, Fremont, CA (US); Renato Padilla, Jr., Folsom, CA (US); Gary F. Besinga, Boise, ID (US); Sampath Ratnam, Boise, ID (US); Vamsi Pavan Rayaprolu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 16/193,171

(22) Filed: Nov. 16, 2018

(65) Prior Publication Data

US 2020/0159447 A1 May 21, 2020

(51) Int. Cl.
*G06F 11/00* (2006.01)
*G06F 11/10* (2006.01)
(Continued)

(52) U.S. Cl.
CPC ........ *G06F 11/1068* (2013.01); *G06F 3/0619* (2013.01); *G06F 3/0659* (2013.01);
(Continued)

(58) Field of Classification Search
CPC .... G06F 3/0659; G06F 3/0619; G06F 3/0679; G06F 11/1068; G11C 16/26; G11C 16/3404; G11C 29/52; G11C 16/0483
(Continued)

(56) References Cited

U.S. PATENT DOCUMENTS

| 8,938,660 B1 * | 1/2015 | Varnica | H03M 13/00 714/774 |
| 2011/0219284 A1 * | 9/2011 | Uchikawa | H03M 13/05 714/763 |

(Continued)

OTHER PUBLICATIONS

"NAND Flash Memory—FortisFlash", Micron TLC 256Gb-2Tb NAND Features MT29F256G08EBHAF, MT29F512G08EEHAF, MT29F1T08EMHAFMT29F2T08EUHAF, (Oct. 21, 2016), 286 pgs.

*Primary Examiner* — Albert Decady
*Assistant Examiner* — Osman M Alshack
(74) *Attorney, Agent, or Firm* — Schwegman Lundberg & Woessner, P.A.

(57) ABSTRACT

Various examples are directed to systems and methods for reading a memory component. A processing device may receive an indication that a read operation at a physical address of the memory component failed. The processing device may execute a plurality of read retry operations at the physical address. The processing device may access a first syndrome weight describing a first error correction operation performed on a result of a first read retry operation of the plurality of read retry operations and a second syndrome weight describing a second error correction operation performed on a result of a second read retry operation of the plurality of read retry operations. The processing device may select a first threshold voltage associated with the first read retry operation based at least in part on the first syndrome weight and the second syndrome weight. The processing device may also execute a first auto read calibrate operation at the physical address, the first auto read calibrate operation having a baseline at the first threshold voltage.

20 Claims, 7 Drawing Sheets

(51) Int. Cl.
  *G06F 3/06* (2006.01)
  *G11C 29/52* (2006.01)
  *G11C 16/26* (2006.01)
  *G11C 16/34* (2006.01)
  *G11C 16/04* (2006.01)

(52) U.S. Cl.
  CPC ............ *G06F 3/0679* (2013.01); *G11C 16/26* (2013.01); *G11C 16/3404* (2013.01); *G11C 29/52* (2013.01); *G11C 16/0483* (2013.01)

(58) Field of Classification Search
  USPC ................................ 714/752, 755, 758, 763
  See application file for complete search history.

(56) References Cited

U.S. PATENT DOCUMENTS

| | | | |
|---|---|---|---|
| 2014/0281770 A1* | 9/2014 | Kim ..................... | G11C 29/028 714/721 |
| 2015/0301888 A1* | 10/2015 | Yang ................... | G06F 11/1068 714/764 |
| 2017/0125114 A1* | 5/2017 | Alhussien ......... | H03M 13/6325 |
| 2017/0154657 A1* | 6/2017 | Kim ....................... | G11C 29/52 |
| 2017/0236592 A1* | 8/2017 | Alhussien .......... | G11C 16/3431 714/721 |
| 2017/0271031 A1* | 9/2017 | Sharon ................ | G06F 11/3058 |
| 2018/0011753 A1* | 1/2018 | Alhussien ........... | G06F 11/0775 |
| 2018/0046527 A1* | 2/2018 | Reusswig ............. | G06F 11/004 |
| 2019/0035485 A1* | 1/2019 | Tate ....................... | G11C 29/42 |
| 2019/0102097 A1* | 4/2019 | Madraswala ......... | G06F 3/0679 |
| 2019/0164599 A1* | 5/2019 | Avraham ............. | G11C 29/028 |

\* cited by examiner

READ RETRY WITH TARGETED AUTO READ CALIBRATE

TECHNICAL FIELD

The present disclosure generally relates to memory sub-systems, and more specifically, relates to recovering data from memory sub-systems that are not read correctly.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a memory sub-system with a read retry feature that utilizes a targeted auto read calibrate operation. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Different memory components can include different types of media. Examples of media include, but are not limited to, a cross-point array of non-volatile memory and flash-based memory cells. Flash memory cells can be configured to individually or collectively to one or a number of programmed states. For example, a single-level cell (SLC) can represent one of two programmed states (e.g., 0 or 1), representing one bit of data. Some flash memory cells can be configured to more than two programmed states. Such cells can be referred to as multi-state memory cells, multi-digit cells, or multi-level cells (MLCs). In certain examples, MLC can refer to a memory cell that can store two bits of data per cell (e.g., one of four programmed states). Triple-level cell (TLC) can refer to a memory cell that can store three bits of data per cell (e.g., one of eight programmed states). Quad-level (QLC) can refer to a memory cell that can store four bits of data (e.g., one of sixteen programmed states). Unless otherwise specified, MLC is used herein in its broader context to refer to any memory cell that can store more than one bit of data per cell (i.e., that can represent more than two programmed states).

The programmed states of a flash memory cell correspond to different levels of charge stored on the memory cell. An SLC memory cell can be configured to one level of charge that corresponds to a first programmed state and to a second level of charge that corresponds to a second programmed state. Similarly, a TLC memory cell has eight levels of charge, each corresponding to a different programmed state. To write a particular programmed state to a memory cell, the memory sub-system charges the memory cell to the level of charge corresponding to the programmed state. To read the memory cell, the memory sub-system measures the level of charge on the cell. To measure the level of charge on the memory cell, the memory sub-system applies to the memory cell a threshold voltage set including one or more threshold voltages. For an SLC memory cell, a threshold voltage set includes a single threshold voltage. For an MLC memory cell, a threshold voltage set includes multiple threshold voltages.

The memory sub-system applies a threshold voltage to the memory cell. If the threshold voltage is sufficient to overcome the voltage drop due to the level of charge at the memory cell, then the memory cell changes state. If the applied threshold voltage is not sufficient to overcome the voltage drop due to the level of charge, the memory cell does not change state. For example, in a negative-and (NAND) memory cell, if an applied threshold voltage is sufficient to overcome the voltage drop to the level of charge at the NAND memory cell, then electricity can be conducted between a source and a drain of the NAND memory cell. If not, an open circuit condition exists between the source and the drain of the NAND memory cell.

In an SLC memory cell, applying the single threshold voltage provides the state of the cell. For example, if the threshold voltage is sufficient to change the state of the memory cell, then the cell is in a first programmed state. If not, then the cell is in a second programmed state. For MLC cells, the additional threshold voltages in the threshold voltage set are applied if the first threshold voltage is insufficient to change the state of the cell. For example, if the first threshold voltage changes the state of the memory cell, then the memory cell is in a first programmed state. If not, additional threshold voltages are applied to distinguish between a second programmed state and additional programmed states associated with higher levels of charge.

Memory cells may be read as a group, referred to herein as a physical address. A physical address is a group of memory cells at a memory sub-system that can be read as part of a common read operation. In NAND memory cells, a physical address may correspond to a page.

For various reasons, the memory sub-system sometimes fail to correctly read a physical address. For example, if the temperature of the memory component changes between the time that a physical address is written and the time that it is read, the level of charge on some or all of the cells may change. Also, for example, a read operation may inadvertently disturb the level of charge on some or all of the cells. Also, in some examples, the level of charge on the memory cells of a physical address may degrade over time. These are just a few examples of the reasons that a memory sub-system may fail to correctly read a physical address.

When the memory sub-system fails to correctly read a physical address, it does not necessarily mean that the data stored at that physical address is lost. Sometimes, the data can be recovered by executing one or more additional read operations at the physical address. In a read retry process, the memory sub-system executes a number of read retry operations at a physical address. Different read retry operations use different threshold voltage sets. In some examples, the levels of charge on the memory cells of the physical address are shifted or otherwise degraded in a manner that allows the physical address to be successfully read by one of the read retry operations.

A read retry process can include one or more read retry operations and one or more auto read calibrate operations. In a read retry operation, the memory sub-system attempts to read the physical address at pre-set threshold voltage levels. In an auto read calibrate operation, the memory sub-system sweeps the threshold voltage level across a range around a baseline threshold voltage or threshold voltage set. Sweeping the threshold voltage level across the range includes selecting a subset of threshold voltages in the range and reading the physical address using the subset of threshold voltages. A set of threshold voltage levels will be identified after the sweeping and then used to read the physical addresses to get data.

A read retry process includes executing a series of read retry operations and a series of auto read calibrate operations using an ordered list of threshold voltage sets. The memory sub-system executes a read retry operation for threshold voltages of the list of threshold voltage sets until either the physical address is successfully read or all of the threshold voltage sets on the list of threshold voltage sets are used. The memory sub-system then begins executing auto read calibrate operations using threshold voltage sets of the list of threshold voltage sets as baselines. In a conventional memory sub-system, auto read calibrate operations use threshold voltage sets from the list in the same order as the read retry operations. That is, if a first read retry operation used a first threshold voltage set and a second read retry operation used a second threshold voltage set, then the first auto read calibrate operation also uses the first threshold voltage set and a second auto read calibrate operation uses the second threshold voltage set.

As can be seen, a read retry process can take significantly longer to complete than a typical read operation. For example, each read retry operation may take about the same time to complete as a read operation. Further, if the read retry process executes auto read calibrate operations, each auto read calibrate operation includes multiple read operations at different threshold voltages, further adding to the process duration.

Aspects of the present disclosure address the above and other deficiencies by executing a read retry process that uses targeted auto read calibrate operations. The memory sub-system executes one or more read retry operations using threshold voltage sets from a list of threshold voltage sets. Each set of threshold voltages on the list may include a single threshold voltage (e.g., for physical addresses using SLC memory cells) or multiple threshold voltages (e.g., for physical addresses using MLC memory cells). If none of the read retry operations is successful, the memory sub-system selects a baseline for at least the first auto read calibrate operation based on syndrome weights generated by an error correction component while determining whether the read retry operations were successful.

For example, the threshold voltage set used with the read retry operation having the lowest syndrome weight may be closest to the threshold voltage or voltages that will successfully read the physical address. Accordingly, executing the first auto read calibrate operation with this threshold voltage set increases the probability that the first auto read calibrate operation will succeed. In turn, this reduces the time to execute the read retry process, for example, by limiting the execution of unnecessary auto read calibration operations.

Figure 1:
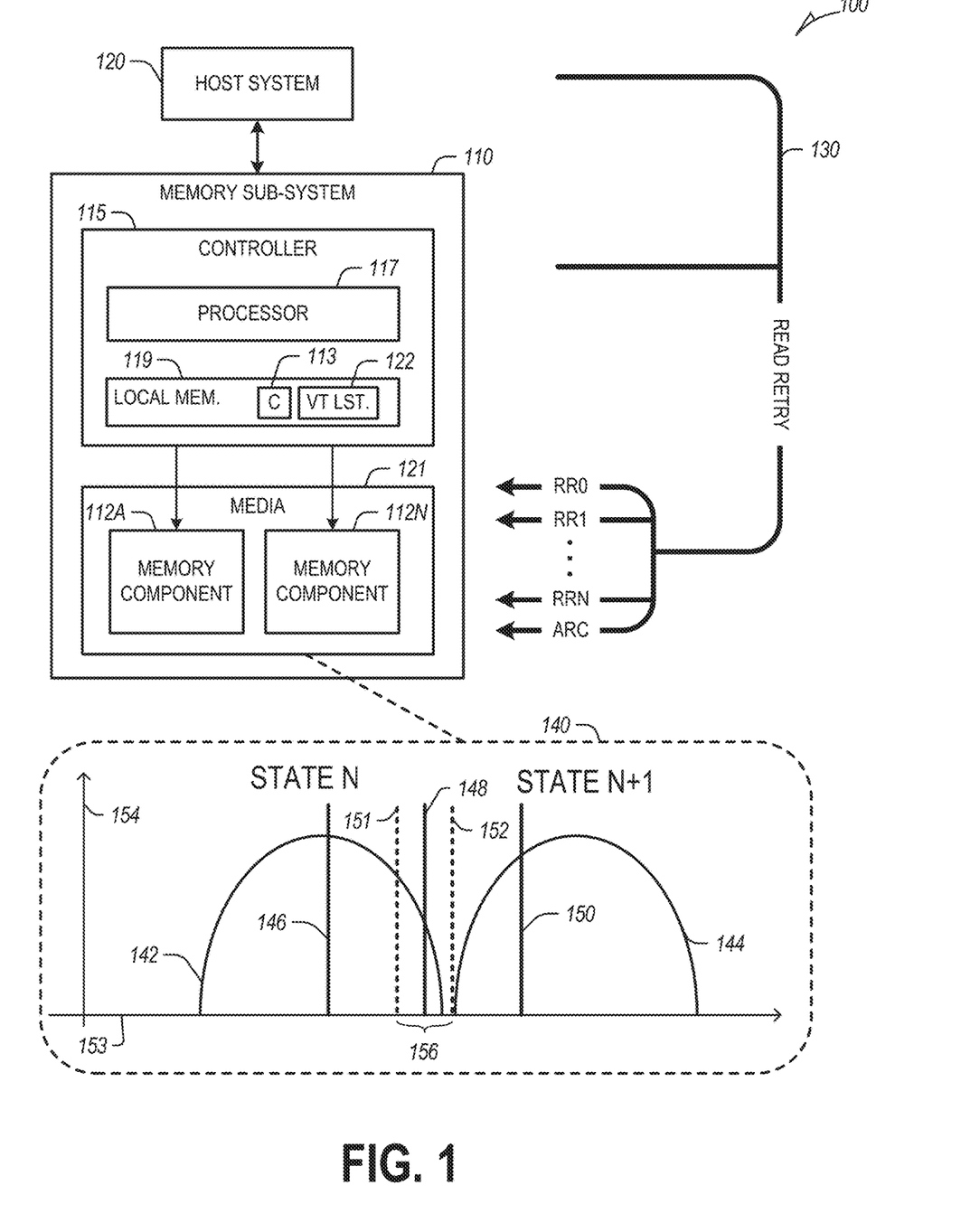
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media 121, such as memory components 112A to 112N. The memory components 112A to 112N can be volatile memory components, non-volatile memory components, or a combination of such. In some embodiments, the memory sub-system 110 is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as SLCs, or MLCs (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code.

In the example environment 100 of FIG. 1, the local memory 119 includes a list 122 of threshold voltage sets. The list of threshold voltage sets includes a number of threshold voltage sets and, in some examples, an order for the threshold voltage sets. During the read retry process 130, the threshold voltage sets of the list 122 can be used in order, for example, for read retry operations. The list of threshold voltage sets can be used out of order, as described herein, for auto read calibrate operations.

Threshold voltage sets in the list 122 may include a single threshold voltage (e.g., for physical addresses including SLC memory cells) or multiple threshold voltages (e.g., for physical addresses including MLC memory cells). The list 122 may correspond to a single physical address and/or to multiple physical addresses. For example, multiple physical addresses corresponding to pages at a common block may use the same list 122 of threshold voltage sets. Also, in some examples, the local memory 119 includes additional lists (not shown) corresponding to other physical addresses.

While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, encryption operations, caching operations, and address translations between a logical address and a physical address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The controller 115 may also include, use, and/or implement an error correction component that performs error correction operations or ECC operations. In some examples, the controller 115 executes instructions for implementing the error correction component. In other examples, the controller 115 includes, or is in communication with, a dedicated ECC engine or other circuitry configured to detect or correct errors associated with writing data to or reading data from one or more memory cells of the memory components 112A, 112N. The error correction component is configured to actively detect and (if possible) recover from error occurrences (e.g., bit errors, operation errors, etc.) associated with various operations or storage of data. The error correction component may maintain the integrity of the data transferred between the host device 120 and the memory device 110. In some examples, the error correction component also removes (e.g., retires) failing memory resources (e.g., memory cells, memory arrays, pages, blocks, etc.) to prevent future errors. The error correction component can be configured to use any suitable error correction algorithm. In some examples, the error correction component is configured to use a low density parity check (LDPC) algorithm.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive a logical address from the controller 115 and decode the logical address to one or more physical addresses at the memory components 112A to 112N.

The computing environment 100 of FIG. 1 shows an example read retry process 130. The read retry process 130 includes read retry operations RR0, RR1, RRN and at least one auto read calibrate operation ARC. The auto read calibrate operation ARC has a baseline at a threshold voltage associated with the read retry operation RR0, RR1, RRN that generated the lowest syndrome weight.

The environment 100 of FIG. 1 includes an example threshold voltage chart 140 for a physical address, such as a page of memory cells. The threshold voltage chart 140 illustrates details of the read retry operations RR0, RR1, RRN and the auto read calibration operation ARC. The threshold voltage chart 140 includes a horizontal axis 153 indicating threshold voltage and a vertical axis 154 indicating a number of memory cells. In the example threshold voltage chart 140, two potential programmed states are shown, labeled State N and State N+1. Each programmed state corresponds to one potential level of charge at the respective memory cells of the physical address. A threshold voltage distribution 142 describes the threshold voltages that change the state of memory cells at the physical address that are written to the programmed state N. A threshold voltage distribution 144 describes the threshold voltages that change the state of memory cells at the physical address that are written to the programmed state N+1. If the physical address includes SLC cells, then states N and N+1 may be the only programmed states. For physical addresses that include MLC cells, there may be additional programmed states with additional threshold voltage distributions and threshold voltages (not shown in FIG. 1).

Threshold voltages 146, 148, 150 are part of sets of threshold voltages included in the list 122 of threshold voltage sets. For example, the threshold voltage 146 is part of a first threshold voltage set. The threshold voltage 148 is part of a second threshold voltage set. The threshold voltage 150 is part of a third threshold voltage set. In the example of FIG. 1, the read retry operation RR0 reads the physical address using the first threshold voltage 146. The read retry operation RR1 reads the physical address using the second threshold voltage 148. The read retry operation RRN reads the physical address using the third threshold voltage 150. Additional threshold voltages not shown in the threshold voltage chart 140 may be part of the threshold voltage list 122 and may be used for the read retry process 130 for additional read retry operations.

As shown, the threshold voltage 146 falls in the middle of the threshold voltage distribution 142 corresponding to programmed state N. Accordingly, the read retry operation RR0 is likely to fail because, using the threshold voltage 146, some portion of the memory cells at the physical address that are configured to the programmed state N will be read as being in the programmed state N+1. The read retry operation RR1 is also likely to fail because, as shown, the threshold voltage 148 also falls within the threshold voltage distribution 142. The threshold voltage 150, as shown, falls within the threshold voltage distribution 144 for the programmed state N+1, meaning that the read retry operation RRN is also likely to fail.

As described, executing read retry operations RR0, RR1, RRN includes reading the physical address using a single threshold voltage set selected from the list 122. In contrast, an auto read calibrate operation, such as ARC, includes sweeping a number of threshold voltages within a range around a baseline threshold voltage. For example, when a threshold voltage set includes a single threshold voltage, an auto read calibrate operation uses that threshold voltage as a baseline and sweeps threshold voltages around the single threshold voltage. When a threshold voltage set includes multiple threshold voltages, the auto read calibrate operation may use multiple threshold voltages from the set as baselines and sweep around each of the baseline threshold voltages.

In the example of FIG. 1, the auto read calibration operation ARC has a baseline at the threshold voltage 148. The auto read calibration operation ARC sweeps a range 156 of threshold voltages around the baseline, where bounds of the range are indicated by threshold voltages 151 and 152. Sweeping the range 156 includes reading the physical address with multiple threshold voltages selected from the range 156.

The memory sub-system 110 determines whether a particular read of a physical address has succeeded or failed using error correction bits, as described herein. In this way, the memory sub-system 110 may determine the success or failure of a read operation, a read retry operation, all or part of an auto read calibration operation, or other suitable operation. A read produces from the physical address a data unit and error correction bits. The error correction bits can be referred to by different names, for example, depending on the error correction algorithm that is implemented. For example, error correction bits are sometimes referred to as ECC bits. Also, for example when an LDPC error correction algorithm is used, the error correction bits can be referred to as an LDPC code.

The error correction component compares the data unit to the error correction bits. This includes examining one or more relationships between the bits of the data unit. The relationships are then compared to the error correction bits. The error correction component generates a syndrome weight that describes the data unit and the error correction bits. If the syndrome weight has a particular value (e.g., zero), then the data unit matches the error correction bits, indicating that the data unit was read correctly. If the data unit was not read correctly, but the number of bit errors is small, then the error correction operation can use the error correction bits to correct the data unit. (The number of bit errors that can be corrected depends on the error correction algorithm used, the number of bits in the data unit, and the number of error correction bits.)

Consider an example in which the error correction component is configured to use the LDPC error correction algorithm. During LDPC decoding, bits of data are adjusted to check if a number of parity check equations are satisfied. If all parity check equations are satisfied, then all error bits are corrected successfully. Otherwise, error correction is not successful. A syndrome weight may be used to indicate number of parity check equations that are not satisfied with the adjusted data in the decoding process.

Figure 2:
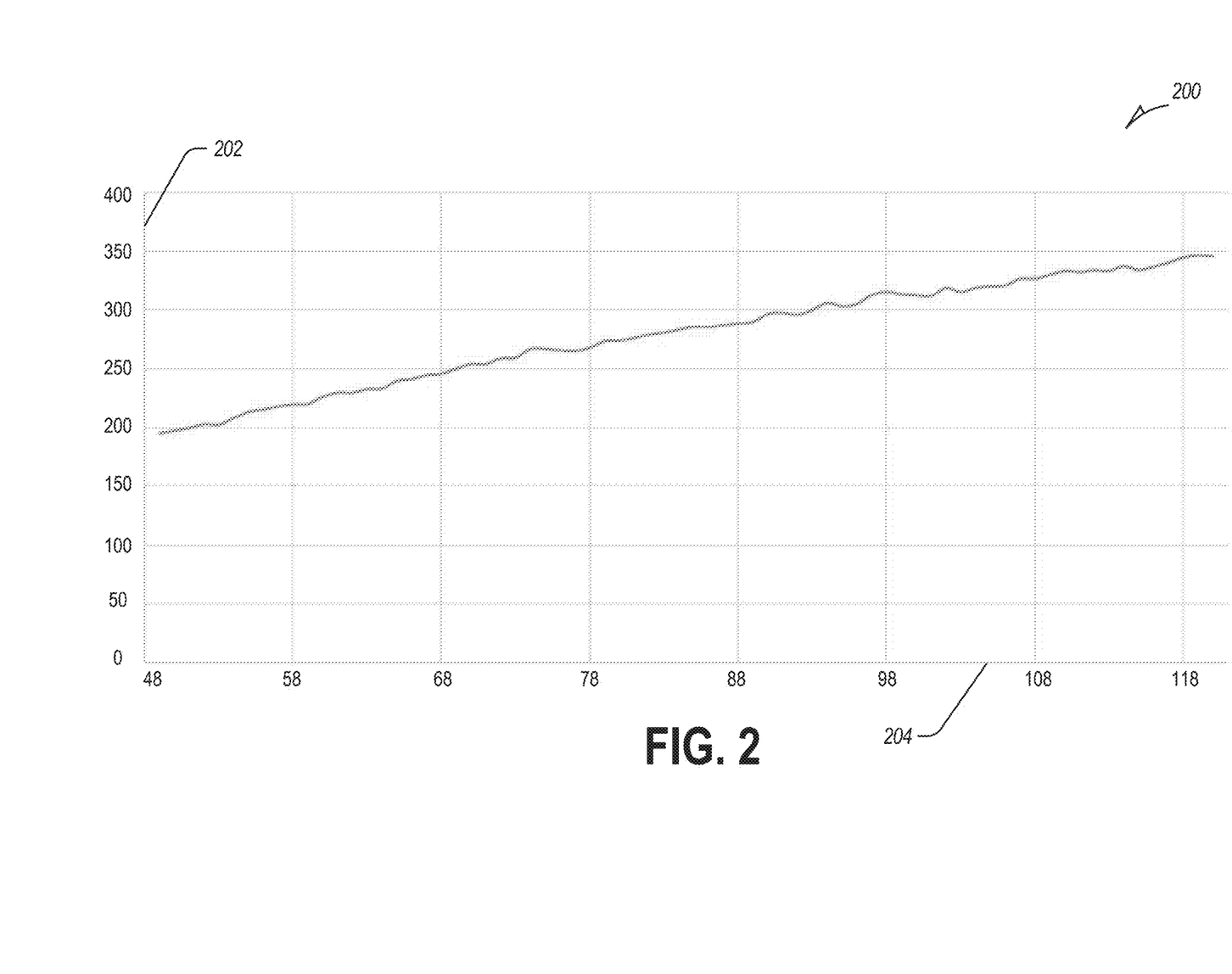
FIG. 2 illustrates a chart showing an example plot of bit errors versus syndrome weight in accordance with some embodiments of the present disclosure.

With some error correction algorithms, the syndrome weight provides an indication of how close a threshold voltage (or set of threshold voltages for MLC memory cells) came to correctly reading a physical address. This is illustrated by FIG. 2, which is a chart 200 showing an example plot of bit errors versus syndrome weight in accordance with some embodiments of the present disclosure. The chart 200 was generated using an error correction component implementing an LDPC error correction algorithm. The vertical axis 202 of the chart 200 shows syndrome weight. The horizontal axis 204 of the chart 200 shows bit errors. As shown, the relationship between syndrome weight and bit errors is roughly linear with a positive slope. Accordingly, lower syndrome weights generally correlate to lower levels of bit errors. This indicates that, if two threshold voltages both failed to successfully read a physical address, the threshold voltage that resulted in the lowest syndrome weight is likely to have generated the fewest bit errors and, therefore, may have come closer to successfully reading the physical address.

Referring back to the threshold voltage chart 140 of FIG. 1, the read retry operation RR1 using the threshold voltage 148 generates the lowest syndrome weight. This can be seen in FIG. 1 because the threshold voltage 148 is closest to falling between the threshold voltage distributions 142, 144.

Accordingly, the read retry process 130 may include selecting the threshold voltage 148 as a baseline for the auto read calibrate operation ARC. As shown, the range 156 of the auto read calibrate operation ARC falls between the threshold voltage distributions 142, 144. Therefore, the auto read calibrate operation ARC may be more likely to successfully read the physical address than if the auto read calibration operation ARC used the threshold voltage 146 or the threshold voltage 150 as its baseline. Executing the auto read calibrate operation ARC with the threshold voltage 148 as a baseline, then, may reduce the time of the read retry process 130.

The read retry process 130 of FIG. 1 can be directed by any suitable component of the environment 100. In the example of FIG. 1, instructions 113 for executing the read retry process 130 are shown at the local memory 119 of the controller 115. For example, the read retry process 130 may be triggered automatically (upon the failure of a read operation at the physical address) or in response to a command from the host system 120. The controller 115 uses the threshold voltage set list 122 to execute the read retry operations RR0, RR1, RRN with the appropriate threshold voltage. The controller 115 stores the resulting syndrome weights. The controller 115 then selects one or more baselines for the auto read calibrate operation ARC using the syndrome weights, as described herein.

In other examples, some or all of the logic for implementing the read retry operation is implemented at other components of the environment 100. For example, the host system 120 may set up and call the read retry operations RR0, RR1, RRN and auto read calibrate operation ARC. The host system 120 may generate and/or store a copy of the threshold voltage list 122. The host system 120 uses the threshold voltage list 122 to instruct the memory sub-system 110 to execute the read retry operations RR0, RR1, RRN. The memory sub-system 110 provides the host system 120 with syndrome weights from the respective read retry operations RR0, RR1, RRN. Using the syndrome weights, the host system 120 selects one or more baselines for the auto read calibrate operation ARC.

Figure 3:
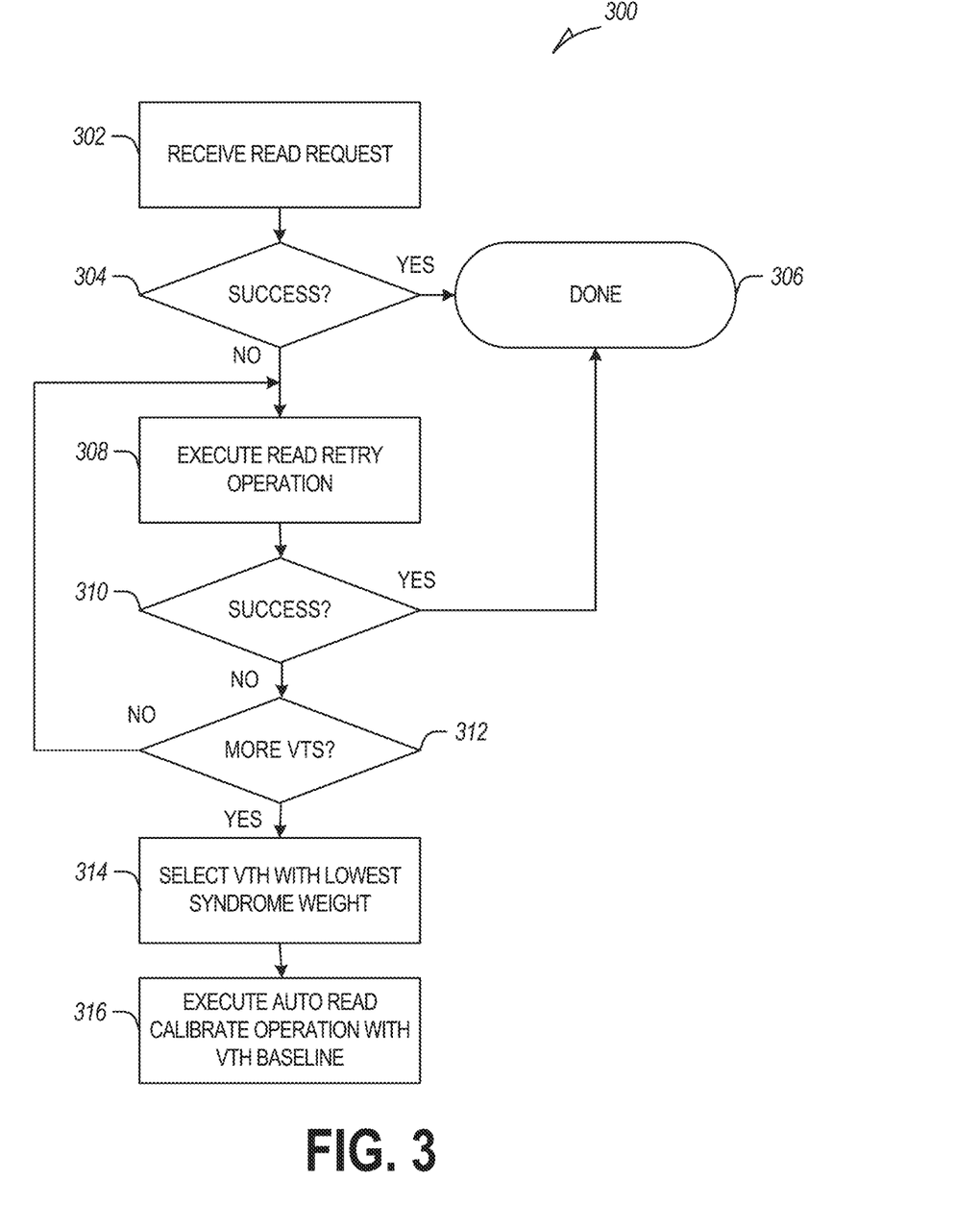
FIG. 3 is a flow diagram of an example method for executing a read retry process, in accordance with some embodiments of the present disclosure.

FIG. 3 is a flow diagram of an example method 300 for executing a read retry process, such as the read retry process 130 of FIG. 1, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 302, the processing logic receives a read request. The read request may indicate a logical address to be read. The processing logic generates a physical address at a memory component that corresponds to the logical address. The processing logic executes a read operation at the physical address, for example, with a default threshold voltage set associated with the physical address.

At block 304, the processing logic determines whether the read operation was successful. For example, an error correction component may compare the data unit returned by the read operation to a set of error correction bits for the physical address. If the read operation was successful, the method 300 concludes at block 306. For example, the data unit retrieved from the physical address at block 302 is returned to the originator of the read request.

If the read operation was not successful, then the processing logic executes a read retry operation at block 308. Initially, the read retry operation at block 308 is executed with a first threshold voltage set from the list of threshold voltage sets. The processing logic determines, at block 310, whether the read retry operation at block 308 was successful. If the read retry operation was successful, then the method 300 concludes at block 306. The data unit retrieved from the physical address at the read retry operation of block 308 is returned to the originator of the read request.

If the read retry operation at block 308 is unsuccessful, then the processing logic determines, at block 312, whether there are additional threshold voltage sets on the threshold voltage list that have not yet been used by read retry operations. If there are additional threshold voltage sets, then the processing logic proceeds back to block 308 to execute a next read retry operation. The next read retry operation is executed with next threshold voltage set of threshold voltage set list, for example, according to the order of the list. The processing logic may also record an association between the threshold voltage set used for the previous read retry operation and the syndrome weight that was generated by the error correction component in determining that the read retry operation failed.

If the processing logic determines at block 312 that all threshold voltage sets from the list of threshold voltages have been used, then the processing logic selects, at block 314, the threshold voltage set that generated the lowest syndrome weight. At block 316, the processing logic executes an auto read calibrate operation with the threshold voltage selected at block 314 as a baseline. If the auto read calibrate operation is unsuccessful, the processing logic may execute additional auto read calibrate operations using different threshold voltage sets from the list, for example, as described herein at FIGS. 6 and 7.

The method 300 shows an example where a read retry process is executed automatically upon the failure of a read operation. In other examples, a read retry process is executed when requested by the host and/or the memory sub-system controller. For example, blocks 302 and 304 may be omitted in some examples and the processing logic may proceed to block 308 when it receives a request or command to begin a read retry process.

Figure 4:
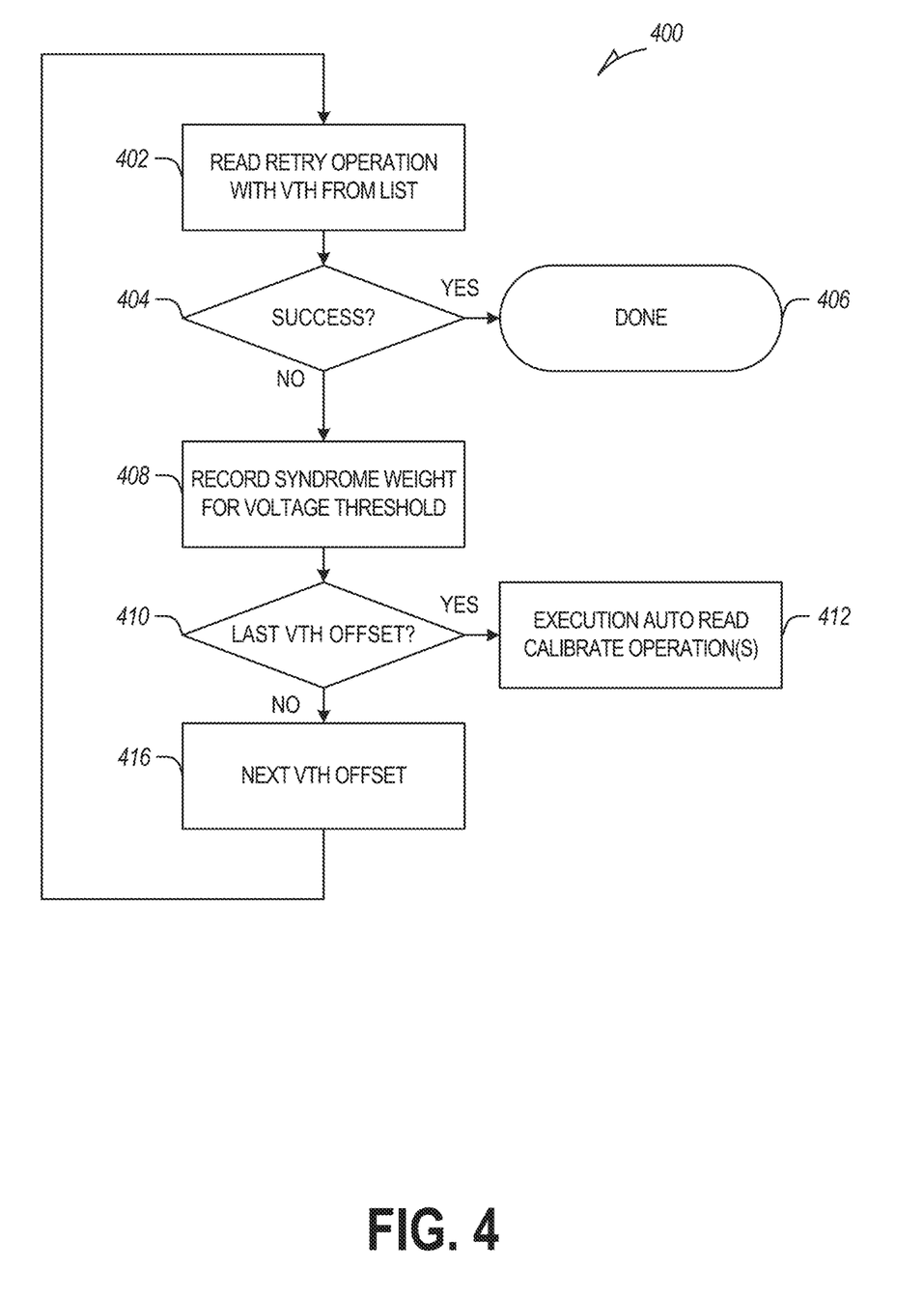
FIG. 4 is a flow diagram of another example method for executing a read retry process, in accordance with some embodiments of the present disclosure.

FIG. 4 is a flow diagram of another example method 400 for executing a read retry process, such as the read retry process 130 of FIG. 1, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 402, the processing logic executes a read retry operation with a threshold voltage set from the list of threshold voltages. As described herein, the processing logic executes read retry operations with threshold voltage sets from the list in an order that is indicated by the list. Accordingly, the first time that the processing logic executes a read retry operation, it may use a first threshold voltage set from the list. The second time that the processing logic executes a read retry operation, it may use the second threshold voltage set from the list, and so on.

At block 404, the processing logic determines if the read retry operation executed at block 402 was successful, for example, as described herein. If the read retry operation was successful, then the method 400 concludes at block 406. The data unit returned from the physical address by the read retry operation may be returned as a result of the read retry process.

If the read retry operation at block 402 is not successful, the processing logic, at block 408, records a syndrome weight associated with the read retry operation and/or with the threshold voltage set used to execute the read retry operation. At block 410, the processing logic determines if the threshold voltage set used for the read retry at block 402 is the final threshold voltage set at the list of threshold voltages. If not, then the processing logic moves to the next threshold voltage set from the list at block 416. The processing logic executes a next read retry operation with the next threshold voltage set at block 402. If the threshold voltage set used for the read retry at block 402 is the final threshold voltage set at the list of threshold voltages, then the processing logic executes one or more auto read calibrate operations at block 412. For example, the processing logic selects the threshold voltage set associated with the lowest syndrome weight. A first auto read calibrate operation is executed with the selected threshold voltage set.

Figure 5:
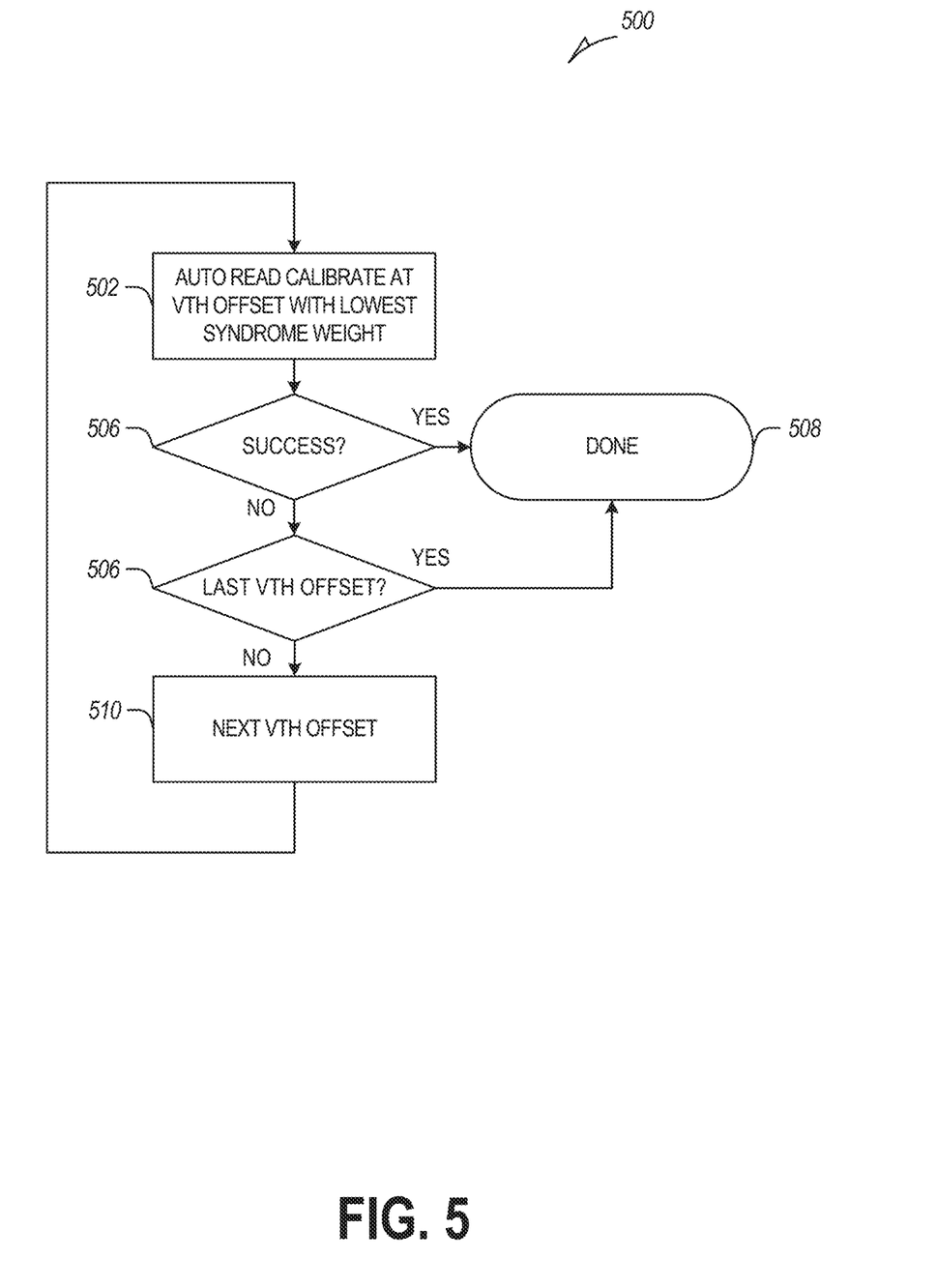
FIG. 5 is a flow diagram of an example method for executing one or more auto read calibrate operations in a read retry process in accordance with some embodiments of the present disclosure.

FIG. 5 is a flow diagram of an example method 500 for executing one or more auto read calibrate operations in a read retry process, such as the read retry process 130 of FIG. 1, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 500 may be executed after a number of read retry operations have been executed, e.g., unsuccessfully. As described herein, the read retry operations use threshold voltage sets from a list of threshold voltage sets. Accordingly, threshold voltage sets of the list of threshold voltage sets may be associated with syndrome weights generated from the read retry operations as described herein.

At block 502, the processing logic executes an auto read calibrate operation at the physical address. The auto read calibrate operation of block 502 uses as a reference at least one threshold voltage from the threshold voltage set associated with the lowest syndrome weight. For example, when the threshold voltage sets include multiple threshold voltages, the auto read calibration operation of block 502 may be executed with multiple baselines. Each threshold voltage of the threshold voltage set may be used as a baseline. At block 506, the processing logic determines if the auto read calibrate operation was successful. If yes, then the method 500 may conclude at block 508.

If the auto read calibrate operation was unsuccessful, the processing logic determines, at block 506, whether there are any threshold voltage sets at the list of threshold voltage sets that have not yet be used as a reference for an auto read calibrate operation. If yes, then the method ends at block 508, for example, without successfully recovering data from the physical address. If one or more threshold voltage sets have not yet be used as a reference for an auto read calibrate operation, the processing logic selects the next threshold voltage set from the list at operation 510. For example, after initially using the threshold voltage or set thereof with the lowest syndrome weight, the processing logic may use the threshold voltage sets in the list in order for subsequent auto read calibrate operations, if necessary. The processing logic executes a next auto read calibrate operation at block 502.

Figure 6:
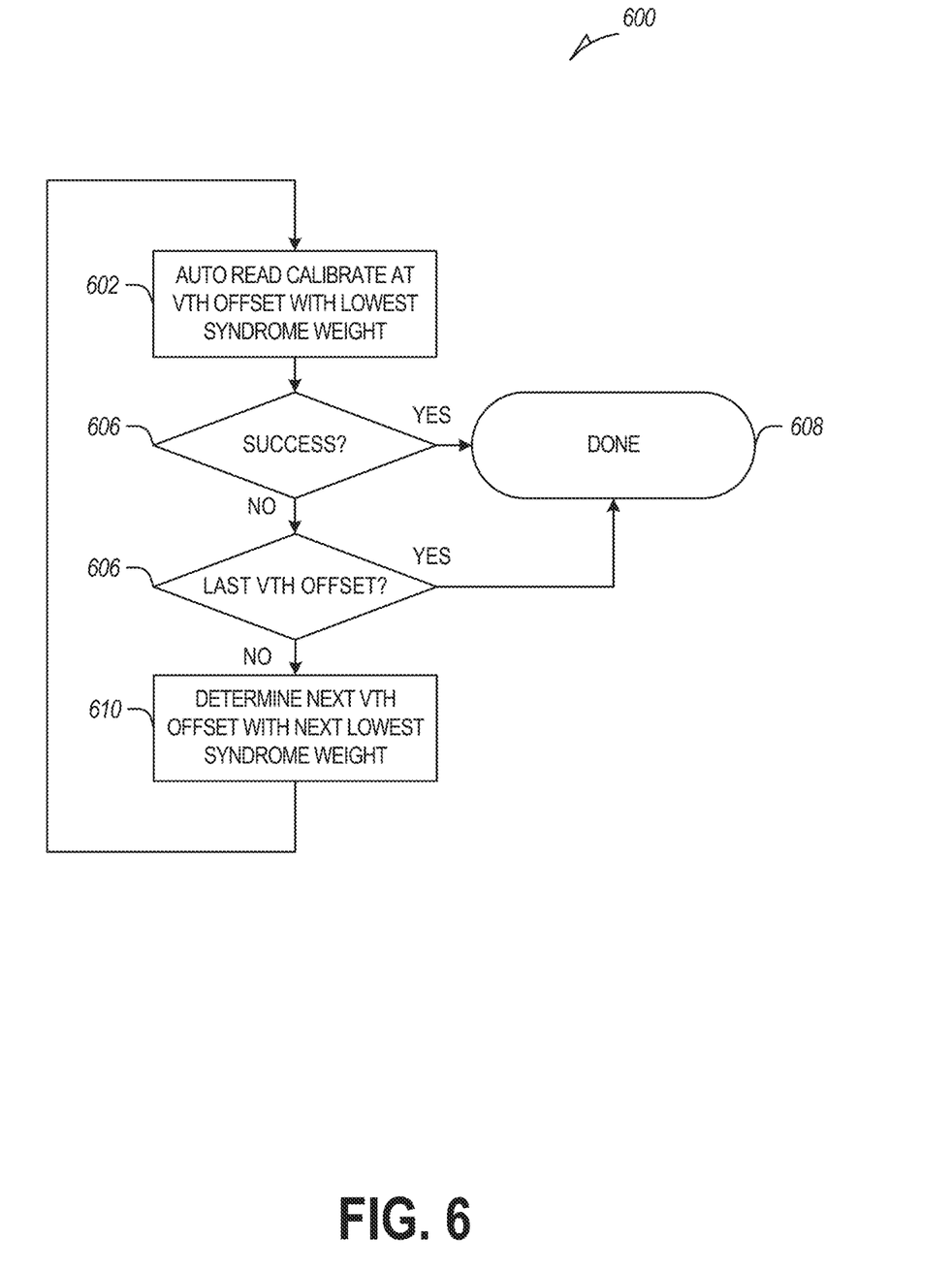
FIG. 6 is a flow diagram of another example method for executing one or more auto read calibrate operations in a read retry process in accordance with some embodiments of the present disclosure.

FIG. 6 is a flow diagram of another example method 600 for executing one or more auto read calibrate operations in a read retry process, such as the read retry process 130 of FIG. 1, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 600, like the method 500, may be executed after a number of read retry operations have been executed, e.g., unsuccessfully. Accordingly, threshold voltage sets of the list of threshold voltage sets may be associated with syndrome weights generated from the read retry operations as described herein. At block 602, the processing logic executes an auto read calibrate operation at the physical address. The auto read calibrate operation of block 602 uses as a reference at least one threshold voltage from the threshold voltage set associated with the lowest syndrome weight. At block 606, the processing logic determines if the auto read calibrate operation was successful. If yes, then the method 600 may conclude at block 608.

If the auto read calibrate operation was unsuccessful, the processing logic determines, at block 606, whether there are any threshold voltage sets at the list of threshold voltage sets that have not yet be used as a reference for an auto read calibrate operation. If yes, then the method ends at block 608, for example, without successfully recovering data from the physical address. If one or more threshold voltage sets at the list of threshold voltages that have not yet be used as a reference for an auto read calibrate operation, the processing logic selects the next threshold voltage set from the list at operation 610. In the example method 600, the next threshold voltage set is the threshold voltage set that is associated with the next lowest syndrome weight. In this way, the processing logic progresses through the threshold voltage sets in order of descending syndrome weights.

Figure 7:
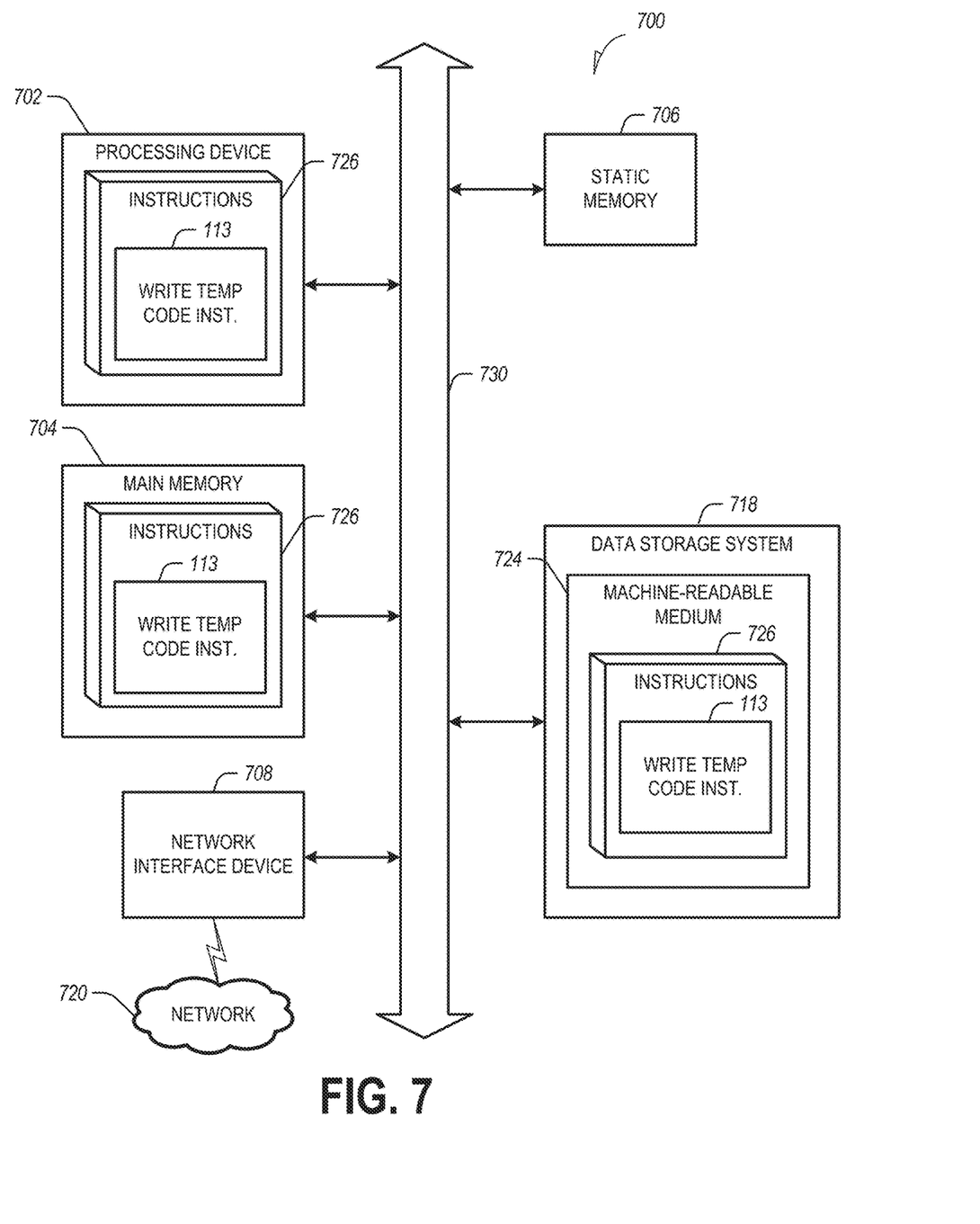
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to execute instructions 713 for executing a read retry process as described herein. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a non-transitory machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions 713 to implement functionality corresponding a read retry process, as described herein. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory component comprising one or more memory cells corresponding to a physical address; and
   a processing device operably coupled to the memory component, the processing device configured to perform operations comprising:
   receiving an indication that a read operation at the physical address of the memory component failed;
   executing a plurality of read retry operations at the physical address;
   accessing a first syndrome weight describing a first error correction operation performed on a first result of a first read retry operation of the plurality of read retry operations;
   accessing a second syndrome weight describing a second error correction operation performed on a second result of a second read retry operation of the plurality of read retry operations;
   selecting a first threshold voltage associated with the first read retry operation based at least in part on the first syndrome weight and the second syndrome weight;
   executing a first auto read calibrate operation at the physical address, the first auto read calibrate operation having a baseline at the selected first threshold voltage;
   receiving an indication that the first auto read calibrate operation failed;
   selecting a second threshold voltage associated with the second read retry operation; and
   executing a second auto read calibrate operation at the physical address, the second auto read calibrate operation having a baseline at the selected second threshold voltage.

2. The system of claim 1, wherein the selecting of the first threshold voltage is based at least in part on determining that the first syndrome weight is less than the second syndrome weight.

3. The system of claim 1, wherein:
   the operations further comprise accessing a third syndrome weight describing a third error correction operation performed on a third result of a third read retry operation of the plurality of read retry operations; and
   the selecting of the first threshold voltage is further based at least in part on the third syndrome weight.

4. The system of claim 3, wherein:
   the selecting of the second threshold voltage associated with the second read retry operation is based at least in part on the second syndrome weight and the third syndrome weight; and
   the selecting of the first threshold voltage is further based at least in part on the third syndrome weight.

5. The system of claim 1, wherein the selecting of the second threshold voltage is based at least in part on a list indicating an order of threshold voltages.

6. The system of claim 1, wherein the operations further comprise:
   determining that the first read retry operation failed; and
   determining that the second read retry operation failed.

7. The system of claim 1, wherein the operations further comprise:
   accessing an indication that the first auto read calibrate operation was successful; and
   returning a data unit read by the first auto read calibrate.

8. A method comprising:
   receiving an indication that a read operation at a physical address of a memory component failed;
   executing a plurality of read retry operations at the physical address;
   accessing a first syndrome weight describing a first error correction operation performed on a first result of a first read retry operation of the plurality of read retry operations;
   accessing a second syndrome weight describing a second error correction operation performed on a second result of a second read retry operation of the plurality of read retry operations;
   selecting a first threshold voltage associated with the first read retry operation based at least in part on the first syndrome weight and the second syndrome weight;
   executing a first auto read calibrate operation at the physical address, the first auto read calibrate operation having a baseline at the selected first threshold voltage;
   receiving an indication that the first auto read calibrate operation failed;
   selecting a second threshold voltage associated with the second read retry operation; and
   executing a second auto read calibrate operation at the physical address, the second auto read calibrate operation having a baseline at the selected second threshold voltage.

9. The method of claim 8, wherein the selecting of the first threshold voltage is based at least in part on determining that the first syndrome weight is less than the second syndrome weight.

10. The method of claim 8, further comprising accessing a third syndrome weight describing a third error correction operation performed on a third result of a third read retry operation of the plurality of read retry operations, and wherein the selecting of the first threshold voltage is further based at least in part on the third syndrome weight.

11. The method of claim 10, wherein:
    the selecting of the second threshold voltage associated with the second read retry operation is based at least in part on the second syndrome weight and the third syndrome weight; and
    the selecting of the first threshold voltage is further based at least in part on the third syndrome weight.

12. The method of claim 8, wherein the selecting of the second threshold voltage is based at least in part on a list indicating an order of threshold voltages.

13. The method of claim 8, further comprising:
determining that the first read retry operation failed; and
determining that the second read retry operation failed.

14. The method of claim 8, further comprising:
accessing an indication that the first auto read calibrate operation was successful; and
returning a data unit read by the first auto read calibrate.

15. A non-transitory machine-readable storage medium comprising instructions thereon that, when executed by a processing device, cause the processing device to perform operations comprising:
receiving an indication that a read operation at a physical address of a memory component failed;
executing a plurality of read retry operations at the physical address;
accessing a first syndrome weight describing a first error correction operation performed on a first result of a first read retry operation of the plurality of read retry operations;
accessing a second syndrome weight describing a second error correction operation performed on a second result of a second read retry operation of the plurality of read retry operations;
selecting a first threshold voltage associated with the first read retry operation based at least in part on the first syndrome weight and the second syndrome weight;
executing a first auto read calibrate operation at the physical address, the first auto read calibrate operation having a baseline at the selected first threshold voltage;
receiving an indication that the first auto read calibrate operation failed;
selecting a second threshold voltage associated with the second read retry operation; and
executing a second auto read calibrate operation at the physical address, the second auto read calibrate operation having a baseline at the selected second threshold voltage.

16. The non-transitory machine-readable storage medium of claim 15, wherein the selecting of the first threshold voltage is based at least in part on determining that the first syndrome weight is less than the second syndrome weight.

17. The non-transitory machine-readable storage medium of claim 15, wherein the operations further comprise:
accessing a third syndrome weight describing a third error correction operation performed on a third result of a third read retry operation of the plurality of read retry operations, and
wherein the selecting of the first threshold voltage is further based at least in part on the third syndrome weight.

18. The non-transitory machine-readable storage medium of claim 17, wherein:
the selecting of the second threshold voltage associated with the second read retry opera is based at least in part on the second syndrome weight and the third syndrome weight; and
the selecting of the first threshold voltage is further based at least in part on the third syndrome weight.

19. The non-transitory machine-readable storage medium of claim 15, wherein the selecting of the second threshold voltage is based at least in part on a list indicating an order of threshold voltages.

20. The non-transitory machine-readable storage medium of claim 15, wherein the operations further comprise:
determining that the first read retry operation failed; and
determining that the second read retry operation failed.

* * * * *